United States Patent
Suh et al.

(10) Patent No.: US 9,963,346 B2
(45) Date of Patent: May 8, 2018

(54) SEAMLESS HEXAGONAL BORON NITRIDE ATOMIC MONOLAYER THIN FILM AND METHOD OF FABRICATING THE SAME

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Hwansoo Suh, Gunpo-si (KR); Youngjae Song, Seongnam-si (KR); Qinke Wu, Suwon-si (KR); Sungjoo Lee, Seongnam-si (KR); Minwoo Kim, Seoul (KR); Sangwoo Park, Seoul (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 86 days.

(21) Appl. No.: 15/017,753

(22) Filed: Feb. 8, 2016

(65) Prior Publication Data
US 2016/0237558 A1  Aug. 18, 2016

(30) Foreign Application Priority Data

Feb. 12, 2015  (KR) .................. 10-2015-0021777

(51) Int. Cl.
| | |
|---|---|
| C23C 16/34 | (2006.01) |
| C01B 21/064 | (2006.01) |
| C23C 16/02 | (2006.01) |

(52) U.S. Cl.
CPC ........... *C01B 21/064* (2013.01); *C23C 16/02* (2013.01); *C23C 16/0209* (2013.01); *C23C 16/0254* (2013.01); *C23C 16/342* (2013.01)

(58) Field of Classification Search
CPC ... C23C 16/34; C23C 16/342; C23C 16/0209; C23C 16/0218
See application file for complete search history.

(56) References Cited

U.S. PATENT DOCUMENTS

| | | | |
|---|---|---|---|
| 8,592,291 | B2 | 11/2013 | Shi et al. |
| 2004/0058199 | A1 | 3/2004 | Sakamoto et al. |

(Continued)

FOREIGN PATENT DOCUMENTS

| | | | |
|---|---|---|---|
| JP | 64-18436 | * | 1/1989 |
| JP | 2003-64350 | * | 3/2003 |

(Continued)

OTHER PUBLICATIONS

Liu, Lei, et al., "Heteroepitaxial Growth of Two-Dimensional Hexagonal Boron Nitride Templated by Graphene Edges". Science, vol. 343, (6167), Jan. 10, 2014, pp. 163-167.*

(Continued)

*Primary Examiner* — Bret P Chen
(74) *Attorney, Agent, or Firm* — Sughrue Mion, PLLC

(57) ABSTRACT

A seamless hexagonal h-BN atomic monolayer thin film has a pseudo-single crystal structure including a plurality of h-BN grains that are seamlessly merged. Each of the h-BN grains has a dimension in a range from about 10 μm to about 1,000 μm. The seamless hexagonal boron nitride (h-BN) atomic monolayer thin film may be fabricated by a process including pre-annealing a metal thin film at a first temperature in a chamber while supplying hydrogen gas to the chamber; supplying nitrogen source gas and boron source gas to the chamber; and forming the seamless h-BN atomic (Continued)

monolayer thin film having a pseudo-single crystal atomic monolayer structure having a grain dimension in a range from about 10 μm to about 1,000 μm by annealing the pre-annealed metal thin film at a second temperature.

12 Claims, 5 Drawing Sheets

(56) References Cited

U.S. PATENT DOCUMENTS

| | | | |
|---|---|---|---|
| 2005/0081456 A1* | 4/2005 | Ihara | B24D 3/06 51/307 |
| 2011/0256386 A1* | 10/2011 | Shi | C23C 16/342 428/336 |
| 2013/0078424 A1 | 3/2013 | Ding et al. | |
| 2013/0140526 A1* | 6/2013 | Kim | C30B 25/165 257/29 |
| 2013/0240830 A1* | 9/2013 | Seacrist | H01L 21/02458 257/9 |
| 2015/0086460 A1* | 3/2015 | Kim | C23C 18/1204 423/290 |
| 2017/0009350 A1* | 1/2017 | Myllymaki | C23C 18/1696 |
| 2017/0090077 A1* | 3/2017 | Geim | G02B 5/008 |

FOREIGN PATENT DOCUMENTS

| | | |
|---|---|---|
| KR | 101259729 B1 | 4/2013 |
| KR | 1020130063410 A | 6/2013 |

OTHER PUBLICATIONS

Kim, Ki Kang, et al., "Synthesis of Monolayer Hexagonal Boron Nitride on Cu Foil Using Chemical Vapor Deposition". Nano Lett. 2012, 12, 161-166.*
Nagashima, A., et al., "Electronic Structure of Monolayer Hexagonal Boron Nitride Physisorbed on Metal Surfaces". Physical Review Letters, Nov. 20, 1995, vol. 75, No. 21, pp. 3918-3921.*
Wu, Qinke, et al., "Single Crystalline Film of Hexagonal Boron Nitride Atomic Monolayer by Controlling Nucleation Seeds and Domains". Scientific Reports, 5:16159, pp. 1-8 (2015).*
Kang Hyuck Lee et al., "Large-Scale Synthesis of High-Quality Hexagonal Boron Nitride Nanosheets for Large-Area Graphene Electronics", Nano Letters, 2012, 12, pp. 714-718.
Ki Kang Kim et al., "Synthesis of Monolayer Hexagonal Boron Nitride on Cu Foil Using Chemical Vapor Deposition", Nano Letters, 2012, 12, pp. 161-166.
Li Song et al., "Large Scale Growth and Characterization of Atomic Hexagonal Boron Nitride Layers", Nano Letters, 2010, 10, pp. 3209-3215.
Qinke Wu et al., "The synthesis of seamless atomic-monolayer of hexagonal boron nitride on copper by low pressure chemical vapor deposition", Total 15 pages.
Ouyang, et al., "Thermal transport in hexagonal boron nitride nanoribbons", 2010, Nanotechnology, vol. 21, Document 245701, 7 pages total.
Sugino, et al., "Dielectric Constant of Boron Nitride Films Synthesized by Plasma-Assisted Chemical Vapor Deposition", Nov. 1, 2000, The Japan Society of Applied Physics, vol. 39, 5 pages total.
Chen, et al., "Boron nitride nanotubes: Pronounced resistance to oxidation", Mar. 29, 2004, Applied Physics Letters, vol. 84, Issue No. 13, 4 pages total.
Liu, et al., "Ultrathin high-temperature oxidation-resistant coatings of hexagonal boron nitride", 2013, Nature Communications, vol. 4, pp. 1-8.
Husain, et al., "Marine Corrosion Protective Coatings of Hexagonal Boron Nitride Thin Films on Stainless Steel", 2013, ACS Applied Materials & Interfaces, vol. 5, pp. 4129-4135.
Watanabe, et al., "Direct-bandgap properties and evidence for ultraviolet lasing of hexagonal boron nitride single crystal", Jun. 2004, Nature Materials, vol. 3, pp. 404-409.
Watanabe, et al., "Far-ultraviolet plane-emission handheld device based on hexagonal boron nitride", 2009, Nature Photonics, vol. 3, pp. 591-594.
Kubota, et al., "Deep Ultraviolet Light-Emitting Hexagonal Boron Nitride Synthesized at Atmospheric Pressure", Aug. 17, 2007, Science Mag., vol. 317, 4 pages total.
Dean, et al., "Boron nitride substrates for high-quality graphene electronics", Oct. 2010, Nature Nanotechnology, vol. 5, pp. 722-726.
Wang, et al., "Monolayer Hexagonal Boron Nitride Films with Large Domain Size and Clean Interface for Enhancing the Mobility of Graphene-Based Field-Effect Transistors", 2014, Advanced Materials, vol. 26, pp. 1559-1564.
Özçelik, et al., "Nanoscale Dielectric Capacitors Composed of Graphene and Boron Nitride Layers: A First-Principles Study of High Capacitance at Nanoscale", 2013, Journal of Physical Chemistry C, vol. 117, pp. 15327-15334.
Britnell, et al., "Field-Effect Tunneling Transistor Based on Vertical Graphene Heterostructures", Feb. 24, 2012, Science Mag., vol. 335, 5 pages total.
Kim, et al., "Growth of High-Crystalline, Single-Layer Hexagonal Boron Nitride on Recyclable Platinum Foil", 2013, Nano Letters, vol. 13, pp. 1834-1839.
Gao, et al., "Repeated and Controlled Growth of Monolayer, Bilayer and Few-Layer Hexagonal Boron Nitride on Pt Foils", 2013, ACS Nano, vol. 7, Issue No. 6, pp. 5199-5206.
Shi, et al., "Synthesis of Few-Layer Hexagonal Boron Nitride Thin Film by Chemical Vapor Deposition", 2010, Nano Letters, vol. 10, pp. 4134-4139.
Tay, et al., "Growth of Large Single-Crystalline Two-Dimensional Boron Nitride Hexagons on Electropolished Copper", 2014, Nano Letters, vol. 14, pp. 839-846.
Takahashi, et al., "Chemical Vapor Deposition of Hexagonal Boron Nitride Thick Film on Iron", 1979, Journal of Crystal Growth, vol. 47, pp. 245-250.
Geng, et al., "Fractal Etching of Graphene", 2013, Journal of American Chemical Society, vol. 135, pp. 6431-6434.
Lee, et al., "Wafer-Scale Growth of Single-Crystal Monolayer Graphene on Reusable Hydrogen-Terminated Germanium", 2014, Science Mag, vol. 344, 5 pages total.
Zhang, et al., "Anisotropic Hydrogen Etching of Chemical Vapor Deposited Graphene", 2012, ACS Nano, vol. 6, Issue No. 1, pp. 126-132.
Vlassiouk, et al., "Role of Hydrogen in Chemical Vapor Deposition Growth of Large Single-Crystal Graphene", 2011, ACS Nano, vol. 5, Issue No. 7, pp. 6069-6076.

* cited by examiner

SEAMLESS HEXAGONAL BORON NITRIDE ATOMIC MONOLAYER THIN FILM AND METHOD OF FABRICATING THE SAME

CROSS-REFERENCE TO RELATED APPLICATION

This application claims priority from Korean Patent Application No. 10-2015-0021777, filed on Feb. 12, 2015, in the Korean Intellectual Property Office, the disclosure of which is incorporated herein by reference in its entirety.

BACKGROUND

1. Field

Methods and apparatuses consistent with exemplary embodiments relate to a seamless hexagonal boron nitride (h-BN) atomic monolayer thin film and fabrication of the same.

2. Description of the Related Art

A hexagonal boron nitride (h-BN) has a two-dimensional structure, is formed in a hexagonal arrangement of boron atoms and nitrogen atoms, has a high electrical insulating property due to a high band gap of approximately 5.9 eV, and is chemically and physically stable.

A h-BN crystal has a very strong covalent bonding strength and good lubricity. Additionally, h-BN crystal has high stability at a high temperature because the h-BN crystal has a high thermal conductivity and sublimates at a temperature of approximately 3,000° C. without having a melting point. The h-BN crystal also has a high electrical resistance of 105Ω at a high temperature region greater than 1,000° C., and has a true specific gravity of 2.26, which is relatively high among ceramics. Accordingly, h-BN may be used for reducing weight of parts.

A h-BN thin film grown using a chemical vapor deposition (CVD) method of the related art has very small gain size, for example, a few micrometers and grains of the h-BN thin film may have different lattice directions, and therefore, an electric leakage may occur at boundary lines between the grains. Accordingly, the h-BN thin film may show low homogeneous electrical and physical properties. Therefore, it is difficult to use the h-BN thin film as a material for an electronic device.

SUMMARY

Provided is a hexagonal boron nitride (h-BN) atomic monolayer in which a plurality of h-BN grains are seamlessly merged.

Provided is a method of fabricating a seamless h-BN atomic monolayer.

Additional aspects will be set forth in part in the description which follows and, in part, will be apparent from the description, or may be learned by practice of the presented exemplary embodiments.

According to an aspect of an exemplary embodiment, there is provided a hexagonal boron nitride (h-BN) atomic monolayer thin film including a pseudo-single crystal structure including a plurality of h-BN grains that are seamlessly merged, each of the plurality of h-BN grains having a dimension in a range from about 10 μm to about 1,000 μm.

The h-BN atomic monolayer thin film may have a dimension in a range from about 1 cm to 30 cm.

The h-BN atomic monolayer thin film may have no line defect at a grain boundary.

The seamless h-BN atomic monolayer thin film may include a metal thin film under the h-BN atomic monolayer thin film, wherein the metal thin film includes a plurality of metal thin film grains, each of the plurality of metal thin film grains having one of a plurality of crystal direction planes, the h-BN grains on the respective one of the plurality of metal thin film grains have same crystalline direction and each of the plurality of h-BN grains on a grain boundary of the metal thin film has a crystalline direction as same as a crystalline direction of the h-BN grains on one of the metal thin film grains contacting the grain boundary of the metal thin film.

According to an aspect of another exemplary embodiment, there is provided a method of fabricating a h-BN atomic monolayer thin film, the method including: pre-annealing a metal thin film at a first temperature in a chamber while supplying hydrogen gas to the chamber; and forming the h-BN atomic monolayer thin film having a pseudo-single crystal atomic monolayer structure having a grain dimension in a range from about 10 μm to about 1,000 μm by annealing the pre-annealed metal thin film at a second temperature while supplying nitrogen source gas and boron source gas to the chamber in addition to the hydrogen gas.

The pre-annealing and the forming of the h-BN atomic monolayer thin film may be consecutively performed in the chamber.

The first temperature and the second temperature may be substantially the same.

The forming of the h-BN atomic monolayer thin film may include: forming a plurality of h-BN seeds; growing a plurality of h-BN grains, each from a corresponding one of the plurality of h-BN seeds; and forming the seamless h-BN atomic monolayer thin film having a pseudo-single crystal structure by merging the plurality of h-BN grains.

The forming of the h-BN atomic monolayer thin film may include supplying the hydrogen gas in an amount greater from 100 times to 200 times than amounts of the nitrogen source gas and the boron source gas.

The method may further include polishing an upper surface of the metal thin film before the pre-annealing.

The polishing may include at least one selected from chemical polishing, physical polishing, chemical-mechanical polishing, and electrolyte polishing.

The nitrogen source gas may be $NH_3$ or $N_2$.

The boron source gas may be at least one selected from the group consisting of $BH_3$, $BF_3$, $BCl_3$, $B_2H_6$, $(CH_3CH_2)_3B$, and $(CH_3)_3B$.

The nitrogen source and the boron source may include borane or borazine.

The metal thin film may include Ni, Co, Fe, Pt, Pd, Au, Al, Cr, Cu, Mg, Mn, Mo, Rh, Ta, Ti, W, U, V, or Zr.

The plurality of h-BN grains may be grown from a plurality of h-BN seeds having gaps amongst one another, the gaps between the plurality of h-BN seeds ranging between about 10 μm and about 1,000 μm.

The h-BN atomic monolayer thin film made from the seamlessly merged plurality of h-BN grains may have a dimension in a range from about 1 cm to 30 cm.

The plurality of h-BN grains may include the same lattice direction with one another such that the h-BN atomic monolayer thin film is line defect-free at a grain boundary.

The seamless h-BN atomic monolayer thin film may further include a metal thin film provided on the h-BN atomic monolayer thin film, wherein the metal thin film may include a plurality of metal thin film grains, each of the plurality of metal thin film grains having one of a plurality of crystal direction planes, the h-BN grains on respective one of the plurality of metal thin film grains have the same crystalline direction with the respective one of the plurality of metal thin film grains and each of the plurality of h-BN grains on a grain boundary of the metal thin film has the same crystalline direction as a crystalline direction of the h-BN grains on one of the metal thin film grains contacting the grain boundary of the metal thin film.

According to an aspect of another exemplary embodiment, there is provided a method of fabricating a seamless hexagonal boron nitride (h-BN) atomic monolayer thin film, the method including: pre-annealing a metal thin film at a first temperature in a chamber while supplying hydrogen gas to the chamber; supplying nitrogen source gas and boron source gas to the chamber; and forming the seamless h-BN atomic monolayer thin film having a pseudo-single crystal atomic monolayer structure having a grain dimension in a range from about 10 µm to about 1,000 µm from the plurality of h-BN seeds by annealing the pre-annealed metal thin film at a second temperature.

The pre-annealing and the forming of the h-BN atomic monolayer thin film may be consecutively performed in the chamber.

The forming of the h-BN atomic monolayer thin film may include: forming a plurality of h-BN seeds from the supplying nitrogen source gas and boron source gas to the chamber; growing a plurality of h-BN grains from the plurality of h-BN seeds; and forming the seamless h-BN atomic monolayer thin film having the pseudo-single crystal structure by merging the plurality of h-BN grains.

The forming of the h-BN atomic monolayer thin film may include supplying the hydrogen gas in an amount from 100 times to 200 times greater than amounts of the nitrogen source gas and the boron source gas.

The plurality of h-BN seeds may be formed in gaps in a range from about 10 µm to about 1,000 µm amongst one another.

The method may further include polishing a first surface of the metal thin film before the pre-annealing the metal thin film.

The polishing may include at least one of chemical polishing, physical polishing, chemical-mechanical polishing, and electrolyte polishing.

The nitrogen source gas may include at least one of $NH_3$ and $N_2$.

The boron source gas may be at least one selected from the group consisting of $BH_3$, $BF_3$, $BCl_3$, $B_2H_6$, $(CH_3CH_2)_3B$, and $(CH_3)_3B$.

The nitrogen source gas and the boron source gas are supplied by at least one of ammonia borane and borazine.

The metal thin film may include at least one of Ni, Co, Fe, Pt, Pd, Au, Al, Cr, Cu, Mg, Mn, Mo, Rh, Ta, Ti, W, U, V, or Zr.

BRIEF DESCRIPTION OF THE DRAWINGS

The above and/or other aspects of the disclosure will become apparent and more readily appreciated from the following description of the exemplary embodiments, taken in conjunction with the accompanying drawings in which.

DETAILED DESCRIPTION

Figure 1:
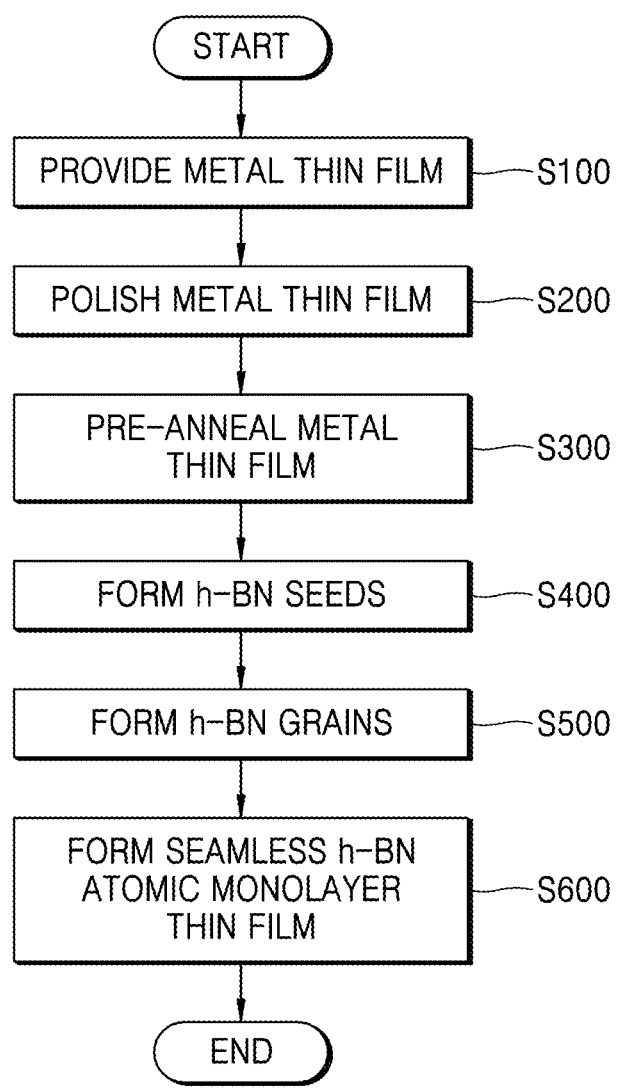
FIG. 1 illustrates a flow chart of a method of fabricating a seamless hexagonal boron nitride atomic monolayer according to an exemplary embodiment.

Reference will now be made in detail to exemplary embodiments, examples of which are illustrated in the accompanying drawings. In the drawings, the thicknesses of layers and regions are exaggerated for clarity. The embodiments described below are exemplary, and thus, may be embodied in many different forms. It will be understood that when an element or layer is referred to as being "on" another element or layer, the element or layer may be directly on another element or layer, or intervening elements or layers. Also, in the drawings, like reference numerals refer to like elements throughout, and the descriptions thereof will not be repeated.

Hereinafter, a method of fabricating a seamless hexagonal boron nitride (h-BN) atomic monolayer will be described.

FIG. 1 illustrates a flow chart of a method of fabricating a seamless hexagonal boron nitride atomic monolayer, according to an exemplary embodiment.

Referring to FIG. 1, a metal thin film is provided (S100). The metal film may have a dimension in a range from about 1 cm to 30 cm. Hereinafter, the dimension may correspond to a diameter of a circle or a length of a side of a polygon.

The metal thin film may include at least one of Ni, Co, Fe, Pt, Pd, Au, Al, Cr, Cu, Mg, Mn, Mo, Rh, Ta, Ti, W U, V and Zr, or an alloy including at least two of these metals. In the exemplary embodiment, a copper thin film having a thickness of approximately 25 µm is used as the metal film.

Next, a surface of the metal thin film is polished (S200).

For example, the surface of the metal thin film may be electropolished. Electropolishing is also referred to as electrolytic polishing. The electropolishing is a process for removing impurities that are present on a surface of the metal thin film by electrolysis, which uses the metal thin film as an electrode. In the exemplary embodiment, the electropolishing is used for removing impurities. However, the exemplary embodiment is not limited thereto. For example, chemical polishing, physical polishing, or chemical-mechanical polishing may also be used instead of the electropolishing. The surface of the metal thin film may be washed during the polishing process.

Generally, a surface of the metal thin film is rough, and thus, h-BN grown on the metal thin film having the rough surface may also have a rough surface. Also, because impurity particles may be present on the surface of the metal thin film, the impurity particles are needed to be removed. A h-BN thin film grown on the surface of the metal thin film may exhibit a uniform and smooth surface if the roughness of the surface of the metal thin film is removed before the h-BN thin film is formed on the surface of the metal thin film.

Next, the metal thin film is pre-annealed (S300).

The prepared (i.e., polished) metal thin film is disposed in a chemical vapor deposition (CVD) chamber, and the metal thin film is annealed for a first duration at a first temperature. For example, when a copper thin film is used as the metal thin film, the first temperature may be in a range from about 900° C. to about 1,050° C. While pre-annealing the metal thin film, $H_2$ gas is supplied at a flow rate of 70 sccm and Ar gas is supplied at a flow rate of 30 sccm into the CVD chamber. The $H_2$ gas maintains the CVD chamber in a reduction atmosphere, and accordingly an oxide of the metal thin film may be removed or the oxidation of the metal thin film may be prevented.

The first duration may be approximately one hour. In the first thermal process (i.e., the metal thing film being pre-annealed), the roughness of the copper thin film may be reduced and the size of grains may be increased. For example, the roughness of the copper thin film before the first thermal process was 59.3 nm, and the roughness of the copper thin film after 1 hour annealing is reduced to approximately 2.47 nm. After 3 hours annealing, the roughness of the copper thin film is further reduced to approximately 0.92 nm. That is, the roughness effect of the copper thin film after the first 1 hour annealing is not remarkable.

Generally, a metal thin film used in a CVD method has a polycrystalline structure. The metal thin film includes a plurality of grains that are separated by grain boundaries. When h-BN is grown on a metal thin film using a method of the related art, a h-BN thin film that includes a line defect along the grain boundaries is formed.

As a result of the pre-annealing of the metal thin film, the grain size of the metal thin film is increased, and accordingly, the quality of the h-BN thin film grown on the metal thin film may be improved. Also, when a metal thin film is pre-annealed at a high temperature, the sizes of grains having the same or similar crystal surface may be increased while atoms of the metal thin film are rearranged. When the grain size of the metal thin film is increased, the size of h-BN grain that is grown on the grain of the metal thin film may also be increased.

Next, a plurality of h-BN seeds are formed on the metal thin film (S400).

After the pre-annealing process, a nitrogen source gas and a boron source gas are consecutively supplied into the CVD chamber. The nitrogen source gas may be $NH_3$ or $N_2$. The boron source gas may be at least one selected from the group consisting of $BH_3$, $BF_3$, $BCl_3$, $B_2H_6$, $(CH_3CH_2)_3B$, and $(CH_3)_3B$. The nitrogen source gas and the boron source gas may be supplied by using ammonia borane or borazine $((BH)_3(NH)_3)$. When the ammonia borane or the borazine is used as the nitrogen source gas and the boron source gas, a molecular ratio of nitrogen and boron of 1:1 may be easily maintained.

In the exemplary embodiment, a borazine gas is used as the nitrogen and boron source gases.

At this process of forming the h-BN seeds, the CVD chamber is maintained at a second temperature and an annealing process is performed for a second duration. The second temperature may be same as the first temperature. The annealing process may be performed consecutively after the pre-annealing process in the same CVD chamber where the pre-annealing is performed.

In the annealing process, hydrogen gas, argon gas, and borazine gas may be supplied to the CVD chamber in a volume ratio of approximately 40:60:0.4. An amount of the hydrogen gas may be approximately 100 to 200 times greater than amounts of the nitrogen source gas and the boron source gas.

The hydrogen gas may prevent oxidation of the copper thin film and suppress a formation of h-BN seeds. The borazine gas is used to form the h-BN seeds on the copper thin film.

FIGS. 2A through 2D are microscope images of h-BN seeds formed on a metal thin film depending on the supply amount of hydrogen gas according to an exemplary embodiment.

Figure 3:
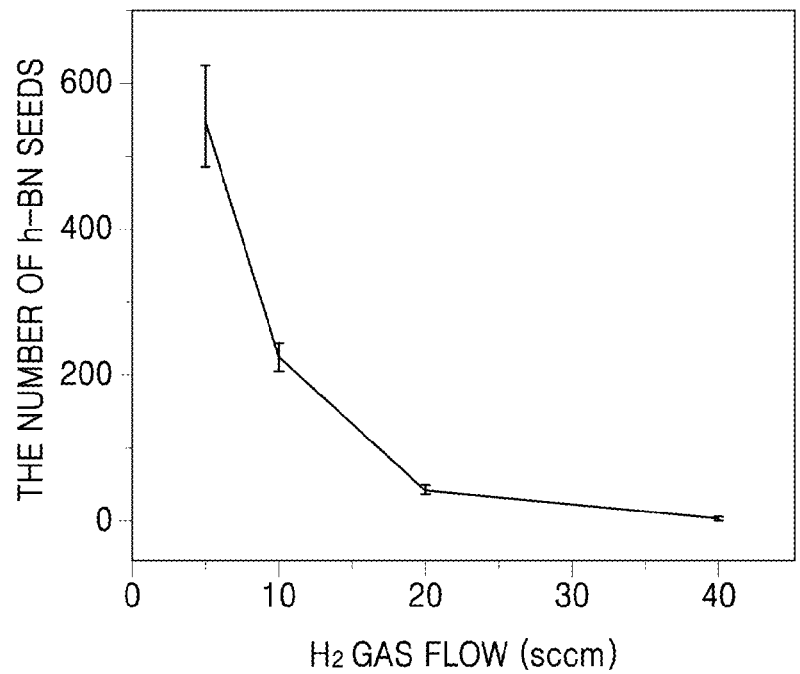
FIG. 3 illustrates a graph showing the density of h-BN seeds depending on the supply amount of hydrogen gas according to an exemplary embodiment.
Figure 4:
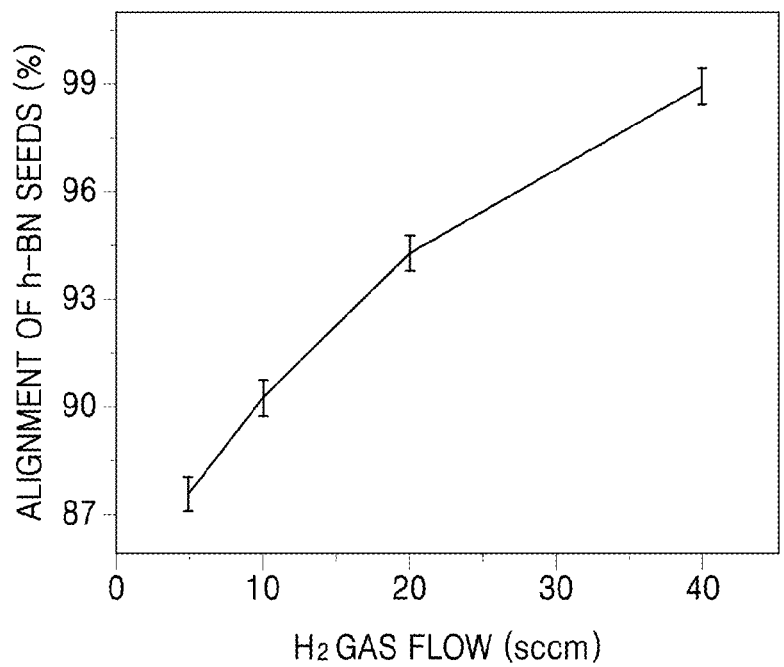
FIG. 4 illustrates a graph showing the aligning degree of h-BN seeds depending on the supply amount of hydrogen gas according to an exemplary embodiment.

FIG. 3 is a graph showing density of h-BN seeds depending on the supply amount of hydrogen gas according to an exemplary embodiment. FIG. 4 is a graph showing a degree of aligning of h-BN seeds depending on the supply amount of hydrogen gas according to an exemplary embodiment.

Figure 2A:
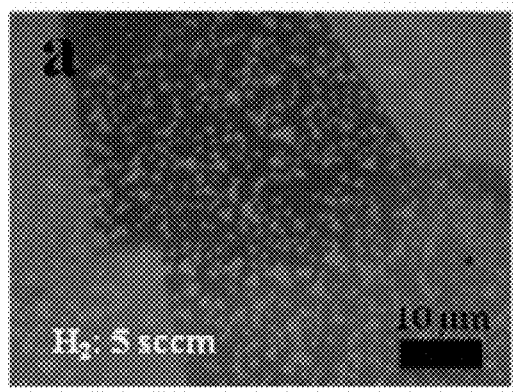
FIGS. 2A through 2D are microscope images of h-BN seeds formed on a metal thin film depending on the supply amount of hydrogen gas according to an exemplary embodiment.
Figure 2B:
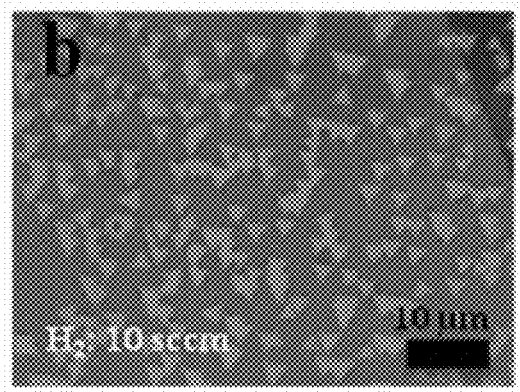
Figure 2C:
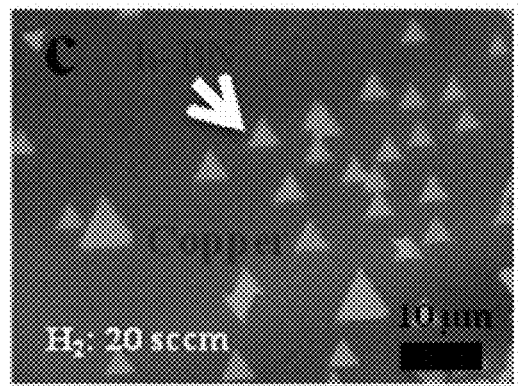
Figure 2D:
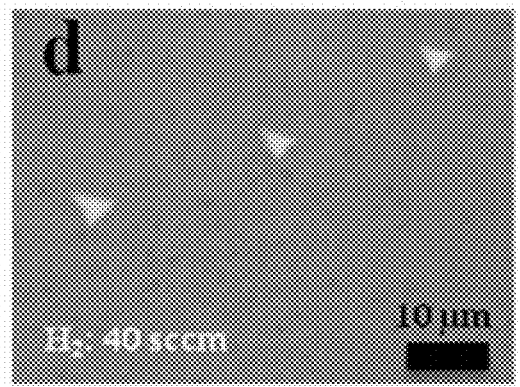

FIGS. 2A through 2D show a distribution of h-BN seeds formed on the copper thin film having a dimension of 60 μm×50 μm. Referring to FIGS. 2A through 2D and FIG. 3, as the supply amount of hydrogen increases from 5 sccm to 40 sccm, gaps between the h-BN seeds increase. That is, the increase in the supply amount of hydrogen suppresses the formation of the h-BN seeds and increases gaps between the h-BN seeds on the metal thin film. Because the size of h-BN grains depends on the gaps between h-BN seeds, the size of the h-BN grains may be increased by increasing the supply of hydrogen. In FIG. 2D, the gaps between the h-BN seeds are approximately from about 10 μm to about 1,000 μm. The h-BN seeds having sizes in a range from about 5 μm to about 100 μm may be obtained by increasing the supply of hydrogen. The sizes of h-BN seeds, grains, and thin film respectively may correspond to diameters.

Although the increase in the supply amount of hydrogen increases the size of h-BN grains, the time for forming the h-BN thin film may also increase.

Referring to FIGS. 2A through 2D and FIG. 4, the degree of alignment of the h-BN seeds on the same grain of the metal thin film with respect to other h-BN seeds is increased as the supply amount of hydrogen increases. For example, when the hydrogen gas is supplied at a rate of 40 sccm, approximately 98% of the h-BN seeds on the same grain of the metal thin film are well aligned in the same direction with other h-BN seeds. Accordingly, most of the h-BN grains grown from the h-BN seeds on the same grain of the metal thin film are grown with the high alignment degree with respect to one another.

Next, the h-BN grains are grown from the h-BN seeds (S500). The h-BN grains may have a size in a range from about 10 μm to about 1,000 μm.

The process for forming the h-BN grains may be consecutively performed at the same conditions as the forming of the h-BN seeds. However, the exemplary embodiment is not limited thereto. For example, the supply amount of the hydrogen gas may be reduced and the supply amounts of the nitrogen source gas and the boron source gas may be increased in comparison with the forming of the h-BN seeds.

Next, a h-BN atomic monolayer thin film is formed by seamlessly merging the h-BN grains (S600). The h-BN atomic monolayer thin film may have a size in a range from about 1 cm to about 30 cm.

The forming of the h-BN atomic monolayer thin film may be simultaneously achieved as the forming of the h-BN grains.

After forming the h-BN atomic monolayer thin film, the CVD chamber may be cooled.

Figure 5:
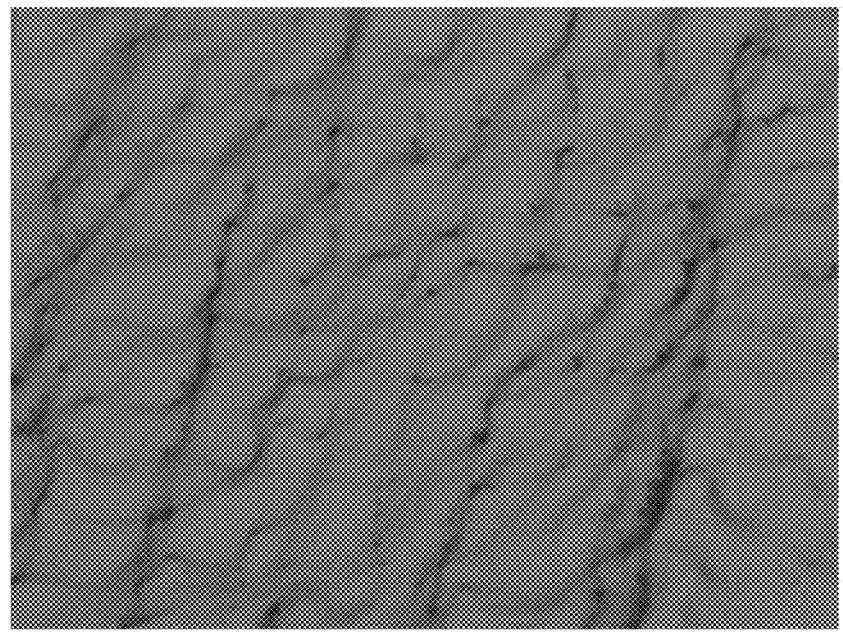
FIG. 5 illustrates a microscope image of a h-BN thin film grown after 5 hours of thermal treatment according to an exemplary embodiment.

FIG. 5 is a microscope image of a h-BN thin film grown for 5 hours annealing at the same condition as the forming of h-BN seeds.

Referring to FIG. 5, the grown h-BN thin film is a seamless h-BN atomic monolayer thin film.

Figure 6:
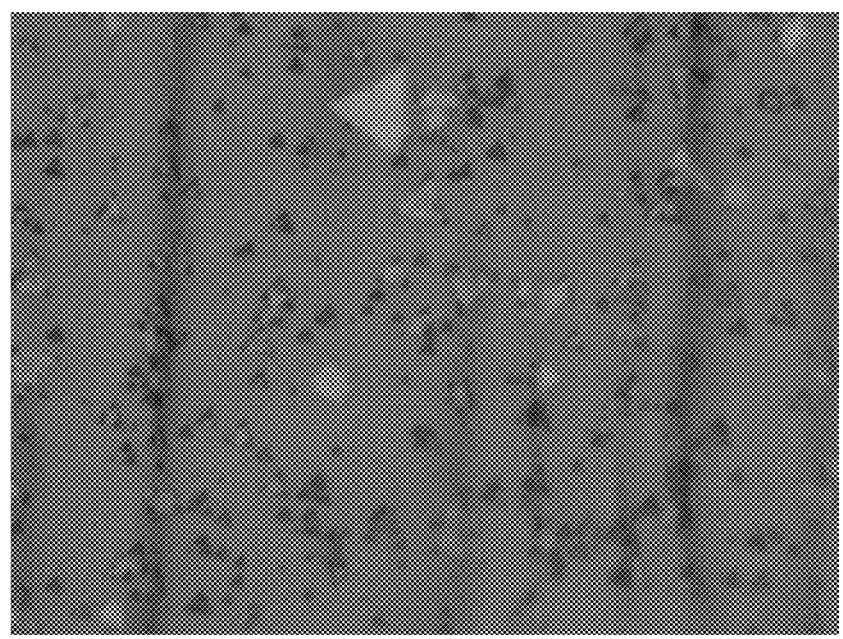
FIG. 6 illustrates a microscope image of a hydrogen etched h-BN thin film according to an exemplary embodiment.

In order to confirm that whether the h-BN thin film is a seamless h-BN atomic monolayer thin film, the resultant product may be etched by hydrogen. The hydrogen etching may be performed at a temperature of 1,050° C. for 1 hour by supplying a hydrogen gas at a rate of 40 sccm. FIG. 6 is a microscope image of a hydrogen etched h-BN thin film according to an exemplary embodiment.

Referring to FIG. 6, in the h-BN atomic monolayer thin film, a h-BN boundary is not observed. This denotes that the resultant product of h-BN atomic monolayer thin film is a single crystalline without seams or a pseudo-single crystal which is analogous to a single crystalline without seams.

Hereinafter, a process of fabricating a seamless h-BN atomic monolayer thin film on a copper thin film will be described.

Figure 7:
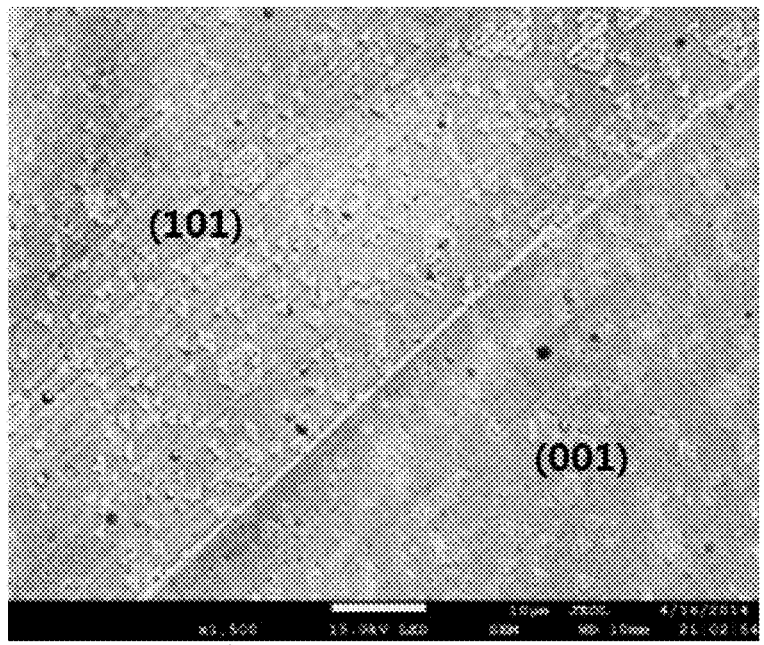
FIG. 7 illustrates a transmission electron microscope (TEM) image of seamlessly merged h-BN grains respectively grown on copper thin film grains having a (001) plane and a (101) plane, according to an exemplary embodiment.

Grains of a copper thin film generally have a [001] plane or a [101] plane. The h-BN grains on the same plane of the copper thin film are grown to a single crystalline. The h-BN grains respectively grown on a [001] and [101] planes of the copper thin film, as shown in FIG. 7, form seamlessly merged single crystalline h-BN grains.

Figure 8:
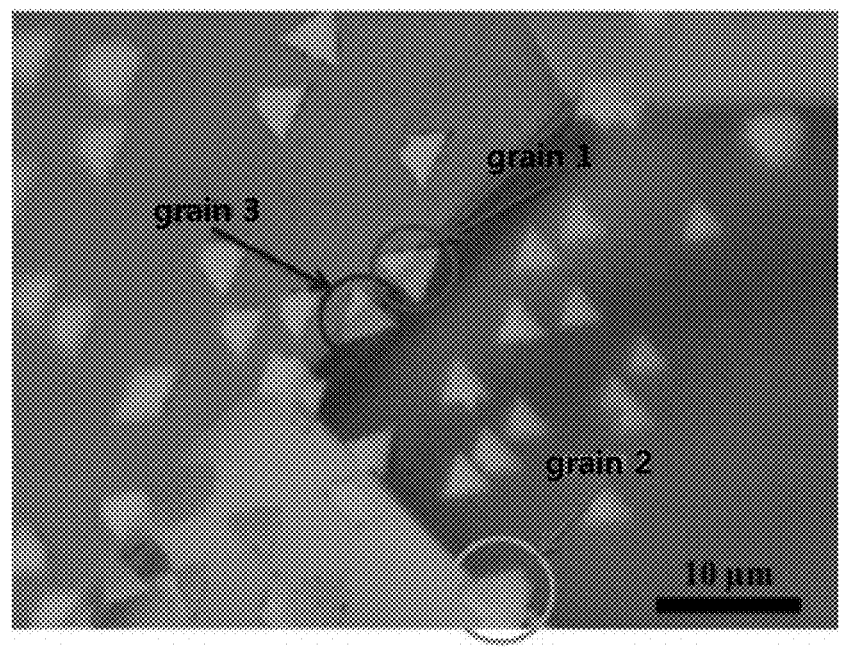
FIG. 8 illustrates a TEM image showing a crystal direction of h-BN grains formed at a boundary of copper thin film grains, according to an exemplary embodiment.

Meanwhile, the h-BN grains that are grown on the copper thin films having different crystal planes from each other are aligned in different crystal directions from each other. At a grain boundary of the copper thin film, the h-BN grains are grown in a crystal direction of the h-BN grain on one of the copper thin film at the grain boundary. That is, referring to FIG. 8, it is observed that one h-BN grain (grain 1) is grown at a same direction with grains on right grain of the copper thin film between two adjacent grains along the grain boundary of the copper thin film, and another one h-BN grain (grain 3) is grown at a same direction with grains on left grain of the copper thin film between two adjacent grains along the grain boundary of the copper thin film. Accordingly, it is observed that the h-BN grains on the grain boundary of the copper thin films are smoothly merged. That is, it is observed that a seamless h-BN atomic monolayer thin film is grown on the adjacent copper thin film grains having different crystal planes from one another. The h-BN atomic monolayer thin film formed as described above is formed as a single crystalline on a metal thin film having a large area, for example, greater than 1 cm² size.

The metal thin film may be removed from the formed h-BN atomic monolayer thin film. For example, the metal thin film may be removed by acid treatment. When the metal thin film is removed after coating a supporting member, for example, polymethyl-metacrylate (PMMA) on the h-BN atomic monolayer thin film before the acid treatment, a subsequent transferring process of the h-BN atomic monolayer thin film may be easily performed.

The h-BN atomic monolayer thin film has slight lattice mismatch with graphene. Therefore, when graphene is formed by using a CVD method after the h-BN atomic monolayer thin film is transferred on a catalyst metal for forming graphene, a good quality of graphene may be obtained.

According to the method of fabricating a h-BN atomic monolayer thin film according to the exemplary embodiment, a h-BN atomic monolayer thin film having a large area pseudo-single crystal structure may be fabricated. The h-BN atomic monolayer thin film having a pseudo-single crystal structure has a large size of pseudo-single crystal formed of a plurality of h-BN grains. Therefore, when the h-BN atomic monolayer thin films are mass-produced, defects are reduced, and the h-BN atomic monolayer thin film is useful for fabricating a graphene device.

While exemplary embodiments have been particularly shown and described above, it will be understood by those of ordinary skill in the art that various changes in form and details may be made therein without departing from the spirit and scope of the inventive concept as defined by the following claims.

What is claimed is:

1. A method of fabricating a seamless hexagonal boron nitride (h-BN) atomic monolayer thin film, the method comprising:
   pre-annealing a metal thin film at a first temperature in a chamber while supplying hydrogen gas to the chamber;
   supplying nitrogen source gas and boron source gas to the chamber; and
   forming the seamless h-BN atomic monolayer thin film having a pseudo-single crystal atomic monolayer structure having a grain dimension in a range from about 10 µm to about 1,000 µm by annealing the pre-annealed metal thin film at a second temperature,
   wherein the forming the seamless h-BN atomic monolayer thin film further comprises:
   forming a plurality of h-BN seeds formed in gaps in a range from about 10 µm to about 1,000 µm amongst one another from the supplying nitrogen source gas and boron source gas to the chamber;
   growing a plurality of h-BN grains from the plurality of h-BN seeds; and
   forming the seamless h-BN atomic monolayer thin film having the pseudo-single crystal structure by merging the plurality of h-BN grains, and supplying the hydrogen gas in an amount from 100 times to 200 times greater than amounts of the nitrogen source gas and the boron source gas.

2. The method of claim 1, wherein the pre-annealing and the forming of the h-BN atomic monolayer thin film are consecutively performed in the chamber.

3. The method of claim 1, wherein the first temperature and the second temperature are substantially the same.

4. The method of claim 1, wherein the seamless h-BN atomic monolayer thin film has a dimension in a range from about 1 cm to about 30 cm.

5. The method of claim 1, wherein the h-BN atomic monolayer thin film is line defect-free at a grain boundary between the plurality of h-BN grains.

6. The method of claim 1, wherein the metal thin film comprises a plurality of metal thin film grains, each of the plurality of metal thin film grains having one of a plurality of crystalline direction planes, the h-BN grains on respective one of the plurality of metal thin film grains have same crystalline direction and each of the plurality of h-BN grains on a grain boundary of the metal thin film has the same crystalline direction as a crystalline direction of the h-BN grains on one of the metal thin film grains contacting the grain boundary of the metal thin film.

7. The method of claim 1, further comprising polishing a first surface of the metal thin film before the pre-annealing the metal thin film.

8. The method of claim 7, wherein the polishing comprises at least one of chemical polishing, physical polishing, chemical-mechanical polishing, and electrolyte polishing.

9. The method of claim 1, wherein the nitrogen source gas comprises at least one of $NH_3$ and $N_2$.

10. The method of claim 1, wherein the boron source gas is at least one selected from the group consisting of $BH_3$, $BF_3$, $BCl_3$, $B_2H_6$, $(CH_3CH_2)_3B$, and $(CH_3)_3B$.

11. The method of claim 1, wherein the nitrogen source gas and the boron source gas are supplied by at least one of ammonia borane and borazine.

12. The method of claim 1, wherein the metal thin film comprises at least one of Ni, Co, Fe, Pt, Pd, Au, Al, Cr, Cu, Mg, Mn, Mo, Rh, Ta, Ti, W, U, V, or Zr.

* * * * *